United States Patent [19]

Shum et al.

[11] Patent Number: 5,633,186
[45] Date of Patent: May 27, 1997

[54] PROCESS FOR FABRICATING A NON-VOLATILE MEMORY CELL IN A SEMICONDUCTOR DEVICE

[75] Inventors: Danny P. C. Shum; Ko-Min Chang; William J. Taylor, Jr., all of Austin, Tex.

[73] Assignee: Motorola, Inc., Schaumburg, Ill.

[21] Appl. No.: 515,077

[22] Filed: Aug. 14, 1995

[51] Int. Cl.$^6$ ...................... H01L 21/8247; H01L 21/265
[52] U.S. Cl. ........................ 438/264; 438/308; 438/289
[58] Field of Search .................. 437/43, 52, 156–157, 437/34, 57, 153; 257/348, 392, 402

[56] References Cited

U.S. PATENT DOCUMENTS

| | | |
|---|---|---|
| 4,302,766 | 11/1981 | Guterman et al. |
| 4,420,871 | 12/1983 | Scheibe . |
| 4,558,509 | 12/1985 | Tiwari . |
| 4,697,198 | 9/1987 | Komori et al. |
| 4,699,690 | 10/1987 | Arakawa . |
| 5,081,054 | 1/1992 | Wu et al. |
| 5,130,769 | 7/1992 | Kuo et al. |
| 5,371,031 | 12/1994 | Gill et al. ...................... 437/52 |

FOREIGN PATENT DOCUMENTS 0 197 284  5/1990  European Pat. Off. .

OTHER PUBLICATIONS

"Process and Device Technologies for 16 Mbit EPROMs With Large-Tilt-Angle Implanted P-Pocket Cell" Yoichi Ohshima, et al., Semiconductor Device Eng. Lab. Toshiba Corp. 1990 IEEE pp. 95–98, month unknown.

Primary Examiner—John Niebling
Assistant Examiner—Richard A. Booth
Attorney, Agent, or Firm—Patricia S. Goddard

[57] ABSTRACT

A process for fabricating a non-volatile memory cell (10) in a semiconductor device includes the formation of a doped region (28) in a semiconductor substrate (40) underlying a floating gate electrode (16) and separated therefrom by a tunnel dielectric layer (44). Stress induced failure of the tunnel dielectric layer (44) is avoided by laterally diffusing dopant atoms under the floating gate electrode (16) after completely fabricating both the floating gate electrode (16) and the underlying tunnel dielectric layer (44).

9 Claims, 2 Drawing Sheets

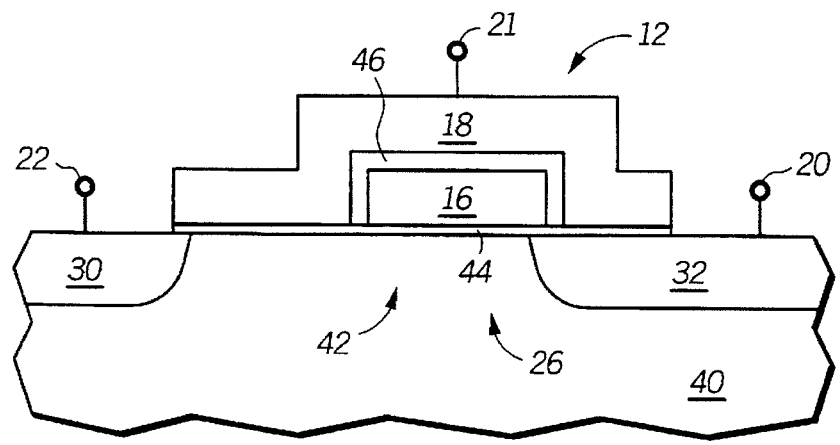
FIG.3
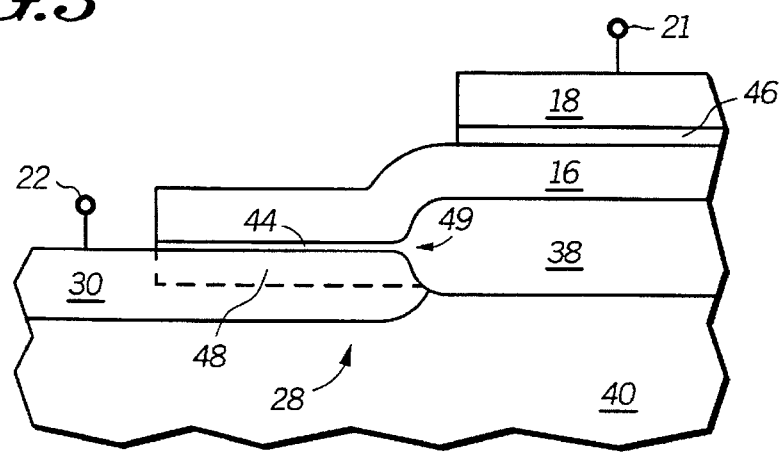
FIG.4
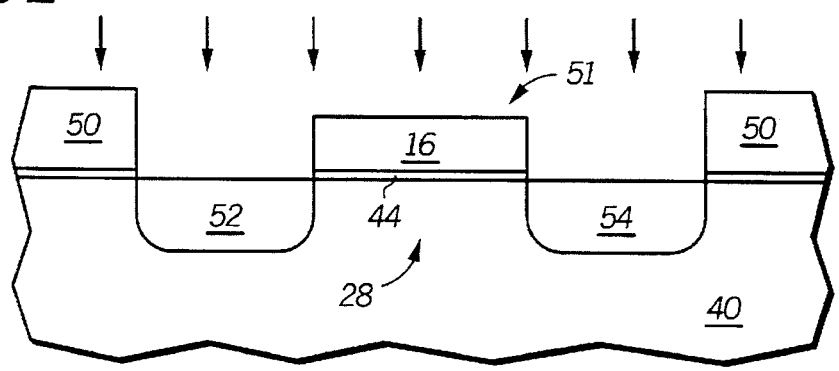
FIG.5-A
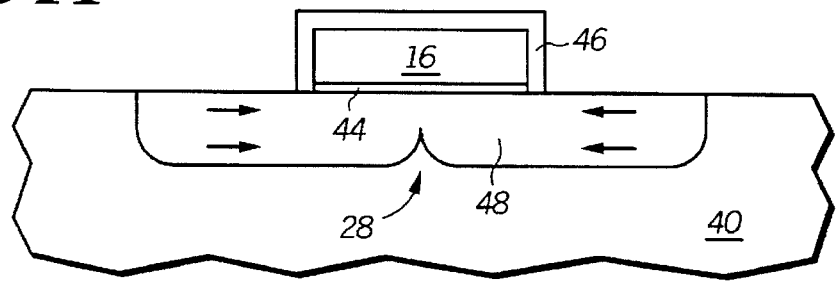
FIG.5-B

PROCESS FOR FABRICATING A NON-VOLATILE MEMORY CELL IN A SEMICONDUCTOR DEVICE

FIELD OF THE INVENTION

This invention relates, in general, to a method for fabricating a semiconductor device, and more particularly, to a method for fabricating a non-volatile memory device.

BACKGROUND OF THE INVENTION

The proper performance of a non-volatile memory device requires that the device retain data programmed into a memory cell within the device. The retention of the data requires that an electrical charge placed on an element of the non-volatile memory cell, such as a floating gate electrode, remain until such time as the cell is erased. Leakage of electrical charge from the floating gate electrode through the underlying dielectric layers and into the semiconductor substrate is a common failure mode of nonvolatile memory devices.

Over the lifetime of a non-volatile memory device, the memory cell is programmed and erased hundreds or even thousands of times. With prolonged use, the tunnel dielectric layer separating the floating gate electrode from the channel region of the floating gate transistor undergoes massive stress as electrical charge is repeatedly transferred through the dielectric layer. Charge transfer induced stress in the tunnel dielectric layer can result in the formation of defects within the dielectric layer and in severe cases, complete cracking of the dielectric material. When this happens, electrical charge leaks away from the floating gate electrode, thus changing the electrical potential of the electrode. This condition is known as data retention failure.

In processing methods of the prior art, a memory cell is fabricated by forming a tunnel region in a semiconductor substrate below the floating gate electrode. Typically, the tunnel region is formed by implanting N-type dopant atoms through a sacrificial oxide layer overlying the semiconductor substrate and into the substrate. A window is then opened in the sacrificial oxide layer exposing the semiconductor substrate, and an oxidation process is carried out to form a thin tunnel dielectric layer overlying the substrate surface. Once the tunnel dielectric layer is formed, a floating gate electrode is defined to overlie the tunnel dielectric layer. During subsequent processing steps, regions of high stress in the semiconductor substrate can result in a non-uniform redistribution of the implanted dopant atoms. One region of severe stress is located at the edge of field oxide regions used to isolate neighboring non-volatile memory cells from one another.

The migration of dopant atoms near the high stress locations leads to localized thinning of the field oxide regions and the tunnel dielectric layer near the interface of the two layers. For example, during fabrication, the field oxide regions encroach into active device regions creating a "bird's beak" structure. The implanted dopant atoms migrate to the bird's beak region and enhance the localized etching of the field oxide and the tunnel dielectric layer during subsequent etching steps carried out to fabricate the device. The localized thinning of the tunnel dielectric layer leads to erratic erasing behavior and reduces the durability of the tunnel dielectric layer resulting in early breakdown. Additionally, the implanted dopant atoms roughen the surface of the semiconductor substrate creating additional stress in the vicinity of the tunnel dielectric layer.

The aforementioned processing methods of the prior art compound substrate stress in the vicinity of the tunnel dielectric layer leading to early voltage breakdown of the dielectric layer. The tunnel dielectric layer prematurely wears out during programming and erasing operations leading to random single bit data retention failure. Accordingly, process improvements are necessary to enhance the reliability and long term performance of non-volatile memory devices.

SUMMARY OF THE INVENTION

In practicing the present invention there is provided a process for fabricating a non-volatile memory cell in a semiconductor device. The process provides a non-volatile memory cell having improved data retention by employing processing steps that reduce stress in substrate regions in close proximity to the tunnel dielectric layer. In one embodiment, a semiconductor substrate of a first conductivity type is provided. A dielectric layer having a thickness sufficient to allow the transport of electrical charge therethrough is formed to overlie the semiconductor substrate. A gate electrode is formed on the dielectric layer and dopant atoms of a second conductivity type are introduced into the substrate on either side of the gate electrode to form two separate doped regions in the semiconductor substrate. Then, thermal energy is applied to the semiconductor substrate to laterally diffuse the dopant atoms from each doped region, such that a continuous doped region is formed underlying the gate electrode.

BRIEF DESCRIPTION OF THE DRAWINGS

FIG. 3 illustrates a cross-sectional view of a portion of the non-volatile memory cell shown in FIG. 2 taken along section line 3—3;

FIG. 4 illustrates a cross-sectional view of a portion of the non-volatile memory cell shown in FIG. 2 taken along section line 4—4; and FIGS. 5(A)–5(B) illustrates processing steps in accordance with the invention.

Figure 1:
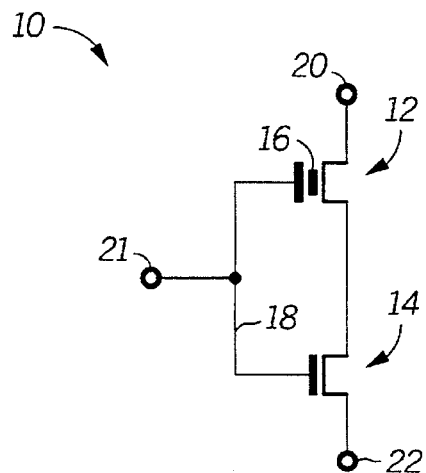
FIG. 1 illustrates a schematic diagram of a non-volatile memory cell.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention provides a process for the fabrication of a semiconductor device including a non-volatile memory cell. The non-volatile memory cell stores information by transferring electrical charge to a floating-gate electrode. A process for fabricating a non-volatile memory device fabricated in accordance with the invention provides a memory cell having improved data retention by implementing a series of processing steps that reduce stress in regions of the semiconductor substrate in proximity to charged transfer sites. In particular, the integrity of the tunnel dielectric layer is improved by reducing processing damage in underlying substrate regions. By improving the integrity of the tunnel dielectric layer, premature breakdown of the tunnel dielectric layer leading to random single bit data retention failure is avoided. The improved tunnel dielectric integrity is obtained, in part, by forming the source region of the floating-gate transistor in the non-volatile memory cell after the floating gate electrode is defined. By covering sensitive regions of the substrate and tunnel dielectric layer with the floating gate electrode, processing damage to the underlying semiconductor substrate is avoided. The necessary doping concentration needed to form the source region is provided by introducing dopant atoms, then laterally diffusing the dopant atoms during subsequent thermal processing steps used to complete the fabrication of the semiconductor device. The advantages of the present invention will be more fully understood following a description of an exemplary non-volatile memory cell and fabrication process.

Shown in FIG. 1 is a schematic diagram of a non-volatile memory cell. A non-volatile memory cell 10 includes a floating gate transistor 12 electrically coupled to an enhancement transistor 14. The floating gate transistor includes a floating gate electrode 16 disposed between the channel region of the floating gate transistor and a control gate electrode 18. Both floating gate electrode 16 and enhancement transistor 14 are electrically controlled by control gate electrode 18. Data is stored in non-volatile memory cell 10 by transferring electrical charge to floating gate electrode 16. For example, for an N-type device, non-volatile memory cell 10 is programmed by applying positive voltages to nodes 20 and 21 while maintaining node 22 near ground potential. Under the applied voltages, electrical charge is transferred from the channel region of floating gate transistor 12 and into floating gate electrode 16. To erase non-volatile memory cell 10, a positive voltage is applied to node 22 while applying a ground potential to node 21. Alternatively, non-volatile memory cell 10 can be erased by applying a small positive voltage to node 22 and a large negative voltage to node 21. Under erasing voltage conditions, charge is transferred from floating gate electrode 16 to node 20 and node 21.

Figure 2:
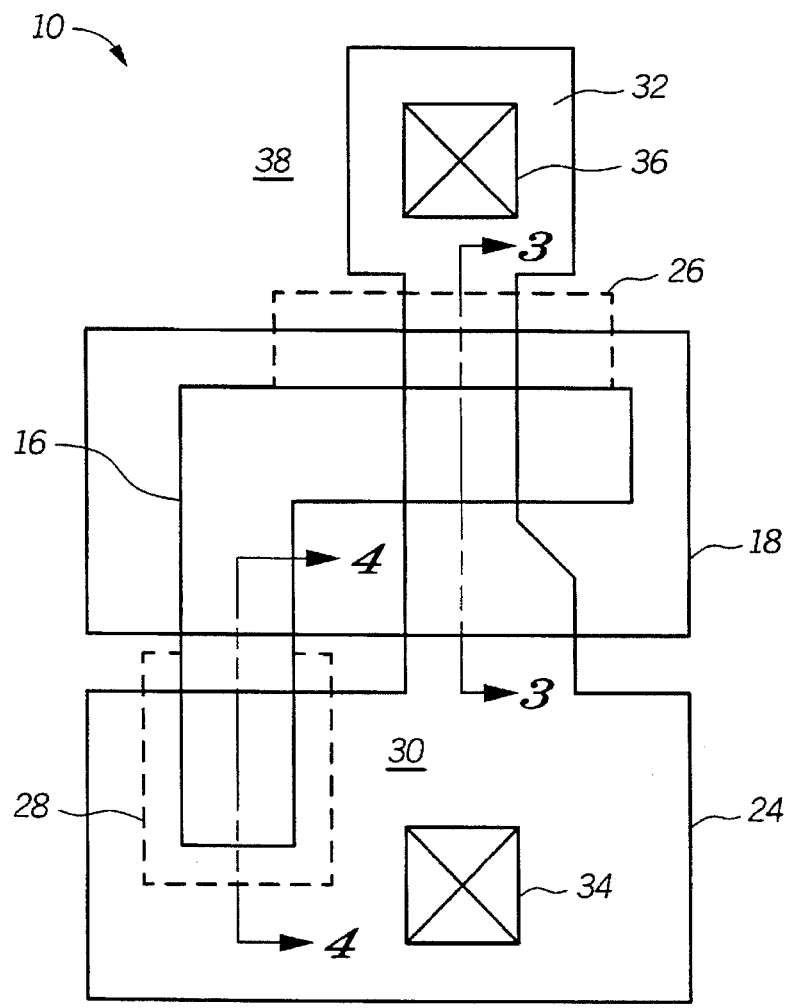
FIG. 2 is a plan view of a non-volatile memory cell fabricated in accordance with the invention.

Shown in FIG. 2 is a plain view of memory cell 10 fabricated in accordance with the process of the invention. An active region 24 includes a programming region 26 and an erasing region 28. Floating gate electrode 16 overlies both programming region 26 and erasing region 28. Control gate electrode 18 overlies a portion of floating gate electrode 16 and a portion of active region 24. A source region 30 and a drain region 32 reside in active region 24 on opposite sides of control gate electrode 18. A source contact 34 and a drain contact 36 provide locations for electrically coupling metal leads to the source and drain regions of floating gate transistor 12. These contacts are illustrated in FIG. I as nodes 22 and 20, respectively. A field oxide region 38 bounds active region 24 providing electrical isolation between non-volatile memory cell 10 and other non-volatile memory cells (not shown) residing in the same semiconductor substrate.

In the operation of non-volatile memory cell 10, electrical charge is transferred to floating gate electrode 16 at programming region 26. Conversely, electrical charge is transferred from floating gate electrode 16 at erasing region 28. The directional control over the charge transfer during operation of memory cell 10 is accomplished by placing source contact 34 in proximity to erasing region 28, and by placing drain contact 36 in close proximity to programming region 26.

FIG. 3 illustrates a cross-sectional view of non-volatile memory cell 10 taken along section lines 3—3 of FIG. 2. Source and drain regions 30 and 32 reside in a semiconductor substrate 40 and are spaced apart by a channel region 42. Floating gate electrode 16 overlies a first portion of channel region 42 and control gate electrode 18 overlies a second portion of channel region 42. A tunnel dielectric layer 44 overlies channel region 42 and separates floating gate electrode 16 and control gate electrode 18 from channel region 42. A second dielectric layer 46 overlies floating gate electrode 16 and separates control gate electrode 18 from. Voltage is applied to drain region 32 at node 20 through drain contact 36 floating gate electrode 16. Correspondingly, voltage is applied to source region 30 at node 22 through source contact 34. The arrow shown in FIG. 3 depicts the direction of charge transfer under programming voltages applied to nodes 20, 21, and 22. Under the applied voltage, electrical charge is transferred from programming region 26 through tunnel dielectric layer 44 and into floating gate electrode 16.

FIG. 4 illustrates a cross-sectional view of non-volatile memory cell 10 taken along section line 4—4 of FIG. 2. A portion of floating gate electrode 16 overlies field oxide region 38 and erasing region 28. Under erasing conditions, electrical charge is transferred from floating electrode 16 through tunnel dielectric layer 44 and into source region 30, as indicated by the arrow shown in FIG. 4. The transfer of electrical charge from floating gate electrode 16 is facilitated through the creation of a doped region 48 in source region 30 directly underlying floating gate electrode 16.

Those skilled in the art will appreciate that floating gate transistor 12 can be either an N-type transistor, or conversely, a P-type transistor. In the case of an N-type floating gate transistor, floating gate electrode 16 is N-type polycrystalline silicon and source region 30 and doped region 38 are formed by introducing N-type dopant species to semiconductor substrate 40. Efficient erasing of non-volatile memory cell 10 requires the creation of a surface potential at tunnel dielectric layer 44 that is conducive to the rapid transfer of negative charge from floating gate electrode 16 to source region 30. Accordingly, both doped region 48 and floating gate electrode 16 are heavily doped with N-type dopant species. In one embodiment, both floating gate electrode 16 and doped region 48 are made N-type by doping with phosphorous. Both source region 30 and drain region 32 are also formed by doping semiconductor substrate 40 with an N-type dopant species.

As illustrated in FIG. 4, erasing region 28 resides in semiconductor substrate 40 in close proximity to field oxide region 38. At erasing region 28, tunnel dielectric layer 44 and field oxide region 38 form a continuous dielectric layer separating floating gate electrode 16 from doped region 48. During the thermal oxidation process used to form field oxide region 38, a bird's beak region 49 is formed as the field oxide encroaches into active region 24. A high degree of stress is created in semiconductor substrate 40 at locations in proximity to bird's beak region 49. This stress is further aggravated by the formation of doped region 48 unless special processing steps are performed to compensate for the increased stress. As previously described, the stress in semiconductor substrate 40 can reduce the integrity of tunnel dielectric layer 44. The present invention avoids the aggravation of stress in semiconductor substrate 40 by forming doped region 48 after control gate electrode 16 is defined on semiconductor substrate 40.

FIGS. 5-A and 5-B illustrate processing steps in accordance with the invention for the formation of doped region 48. As illustrated in FIG. 5-A, a masking layer 50 is formed on semiconductor substrate 40. Masking layer 50 has an opening 51 exposing erasing region 28 and a portion of floating gate electrode 16. Preferably, masking layer 50 is a photoresist material deposited onto semiconductor substrate 40, then exposed and developed to form opening 51 therein. After forming masking layer 50, a doping process is carried out to introduce N-type dopants into semiconductor substrate 40. Preferably, the N-type dopants are introduced by ion implantation using masking layer 50 as an implant mask. In one embodiment, phosphorous is implanted using a dose of about 4E15 to 6E15 ion/cm$^2$ at an implant energy of about 40 KeV to 60 KeV. The doping process forms first and second doped regions 52 and 54 in semiconductor substrate 40 on either side of floating gate electrode 16.

After introducing N-type dopants to semiconductor substrate 40, subsequent thermal processing steps are carried out to complete the fabrication of non-volatile memory cell 10. For example, after introducing the N-type dopants, second dielectric layer 46 is formed to overlie floating gate electrode 16. As illustrated in FIG. 5-b, during the subsequent thermal processing steps, the N-type dopants originally introduced on either side of floating gate electrode 16 are laterally diffused to form a continuous doped region 48 underlying floating gate electrode 16. The thermal energy is such that dopant atoms originally introduced into semiconductor substrate 40 laterally diffuse until the dopant concentration is equalized in doped region 48. The lateral diffusion process results in a uniform dopant concentration throughout doped region 48.

The method of fabrication of doped region 48 provides a substantial improvement in data retention of non-volatile memory cell 10. In the process of the invention, tunnel dielectric layer 44 is completely fabricated and covered by floating gate electrode 16 prior to the introduction of dopant atoms into semiconductor substrate 40. By delaying the introduction of dopant atoms until after the fabrication of tunnel dielectric layer 44, the build up of dopant species along the high stress region of semiconductor substrate 40 in proximity to the edge of field oxide region 38 at bird's beak region 49, is prevented. Since dopant atoms preferably migrate to regions of high stress, if dopant atoms are introduced prior to the fabrication of tunnel dielectric layer 44, a localized increase in dopant concentration will occur at the edge of field oxide region 38. However, the process of the present invention eliminates this problem by introducing dopant atoms after complete fabrication of tunnel dielectric layer 44 and floating gate electrode 16.

Thus it is apparent that there has been provided, in accordance with the invention, a process for fabricating a non-volatile memory cell in a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, although the memory cell is illustrated in a split-gate arrangement other cell arrangements are possible, such as single transistor EPROM, and the like. It is therefore intended to include within the invention all such variations and modifications as fall within the scope of the appended claims and equivalents thereof.

We claim:

1. A process for fabricating a non-volatile memory cell in a semiconductor device comprising the steps of:

providing a semiconductor substrate having an active region therein bounded by a field isolation region, the active region including a programming region and an erasing region, wherein the programming region resides at a first portion of the active region and the erasing region resides at a second portion of the active region;

forming a tunnel dielectric layer overlying the active region;

forming a floating gate electrode of a first conductivity type overlying the programming region and the erasing region, wherein the floating gate electrode is separated from each region by the tunnel dielectric layer;

forming a masking layer overlying the semiconductor substrate, the masking layer having an opening therein exposing the erasing region:

implanting dopant atoms of the first conductivity type into the erasing region using the masking layer and the floating gate electrode as a doping mask to form separate doped regions next to the floating gate electrode;

removing the masking layer;

applying thermal energy to the semiconductor substrate to laterally diffuse the dopant atoms under the floating gate electrode to form a continuous doped region underlying the floating gate electrode; and forming a control gate electrode overlying the floating gate electrode and separated therefrom by a dielectric layer.

2. A process for fabricating a non-volatile memory cell in a semiconductor device comprising the steps of:

provide a semiconductor substrate having an active region therein bounded by a field isolation region, the active region including a programming region and an erasing region, wherein the programming region resides at a first portion of the active region and the erasing region resides at a second portion of the active region:

forming a tunnel dielectric layer overlying the active region:

forming a floating gate electrode of a first conductivity type overlying the programming region and the erasing region, wherein the floating gate electrode is separated from each region by the tunnel dielectric layer;

forming a masking layer overlying the semiconductor substrate, the masking layer having an opening therein exposing the erasing region;

implanting dopant atoms through the floating gate electrode and the tunnel dielectric layer and into the erasing region using the masking layer as a doping mask to form a continuous doped region underlying the floating gate electrode: and forming a control gate electrode overlying the floating gate electrode said separated therefrom by a dielectric layer.

3. A process for fabricating a non-volatile memory cell in a semiconductor device comprising the steps of:

providing a semiconductor substrate of a first conductivity type;

forming a dielectric layer overlying the semiconductor substrate, the dielectric layer having a thickness sufficient to allow transportation of electrical charge therethrough;

forming a gate electrode overlying the dielectric layer;

introducing dopant atoms of a second conductivity type into the semiconductor substrate on either side of the gate electrode to form two separate doped regions; and applying thermal energy to the semiconductor substrate to laterally diffuse the dopant atoms from each doped region, such that a continuous doped region is formed underlying the gate electrode.

4. The process of claim 3, wherein the step of introducing dopant atoms comprises implantation of phosphorus atoms at an implant energy less than 80 KeV and a dose greater than 1.0E15 ions/cm$^2$.

5. The process of claim 3, wherein the step of forming a dielectric layer comprises thermally growing a silicon dioxide layer to a thickness of less than 100 angstroms.

6. The process of claim 3 further comprising the step of contacting the continuous doped region with a metal lead to supply a variable voltage to the continuous doped region, such that charge carriers are generated in the continuous doped region.

7. A process for fabricating a non-volatile memory cell in a semiconductor device comprising the steps of:

providing a semiconductor substrate of a first conductivity type having an active region therein bounded by an isolation region;

forming a first dielectric layer overlying the active region;

forming an opening in the first dielectric layer exposing a portion of the active region;

forming a second dielectric layer overlying in the exposed portion of the active region, the second dielectric layer having a thickness sufficient to allow transportation of electrical charge therethrough;

forming a floating gate electrode of a second conductivity type overlying the isolation region and the second dielectric layer;

introducing dopant atoms of the second conductivity type into the active region on either side of the floating gate electrode to form two separate doped regions; and applying thermal energy to the semiconductor substrate to laterally diffuse the dopant atoms from each doped region, such that a continuous doped region is formed underlying the floating gate electrode.

8. The process of claim 7 further comprising the step of implanting dopant atoms of the second conductivity type into the active region to form a source region on either side of the floating gate electrode.

9. The process of claim 8 further comprising the steps of:

forming a third dielectric layer overlying the floating gate electrode;

forming a control gate electrode overlying the floating gate electrode and separated therefrom by the third dielectric layer;

forming a metal contact to the active region; and applying voltage to the control gate electrode and to the metal contact sufficient to transfer electrical charge from the floating gate electrode through the second dielectric layer and into the active region.

* * * * *